(12) United States Patent
Malocha et al.

(10) Patent No.: US 7,642,898 B1
(45) Date of Patent: Jan. 5, 2010

(54) ORTHOGONAL FREQUENCY CODING FOR SURFACE ACOUSTIC WAVE COMMUNICATION, TAG AND SENSOR APPLICATION

(75) Inventors: Donald C. Malocha, Winter springs, FL (US); Derek Puccio, Orlando, FL (US)

(73) Assignee: University of Central Florida Research Foundation, Inc., Orlando, FL (US)

( * ) Notice: Subject to any disclaimer, the term of this patent is extended or adjusted under 35 U.S.C. 154(b) by 910 days.

(21) Appl. No.: 11/203,260

(22) Filed: Aug. 12, 2005

Related U.S. Application Data

(60) Provisional application No. 60/650,843, filed on Feb. 8, 2005.

(51) Int. Cl.
*H04Q 5/22* (2006.01)

(52) U.S. Cl. ............ 340/10.41; 340/10.42; 340/825.69; 340/825.75; 340/825.76; 340/572.5; 340/572.2

(58) Field of Classification Search .............. 340/572.1, 340/10.1, 572.5, 572.4, 825.69, 825.75, 825.76; 370/206; 310/313, 321, 331
See application file for complete search history.

(56) References Cited

U.S. PATENT DOCUMENTS

| | | | | |
|---|---|---|---|---|
| 6,060,815 | A * | 5/2000 | Nysen | 310/318 |
| 6,992,547 | B2 * | 1/2006 | Bergmann | 333/193 |
| 2003/0231107 | A1 * | 12/2003 | Edmonson et al. | 340/10.42 |

OTHER PUBLICATIONS

Scott E. Carter, Member, IEEE, Saw device Implementation of a Weighted Stepped Chirp Code Signal for Direct Sequence Spread Spectrum communications systems; 2000 IEEE.*

D.C. Malocha, et al., "Orthogonal frequency coding for SAW device application," 2004 IEEE International Ultrasonics, Ferroelectrics, and Frequency Control 50$^{th}$ Anniversary Joint Conference, retrieved from http://caat.engr.ucf.edu/Publications/Orthogonal%20Frequency%20Coding%20for%20SAW%20Device%20Applications_080804.pdf retrieved on Aug. 11, 2005.

* cited by examiner

*Primary Examiner*—Vernal U Brown
(74) *Attorney, Agent, or Firm*—Brian S. Steinberger; Phyllis K. Wood; Law Offices of Brian S. Steinberger, P.A.

(57) ABSTRACT

A secure apparatus, system, device and method for coding surface acoustic wave identification tags and sensors to enable unique sensor operation and identification for a multi-sensor environment. In an embodiment, a pseudo noise sequence is applied to the orthogonally coded signal for increased security. An orthogonal frequency coding technique is applied to the SAW tag using periodic reflector gratings for responding to an orthogonal interrogation signal to transmit the sensor identification and sensed data. A transceiver interrogates the sensor with a stepped chirp corresponding to the orthogonal frequency coded chip frequency response, receives a response from the SAW device, applies an oppositely stepped chirp to the response and then uses matched filtering to produce a compressed pulse. The orthogonal frequency coding technique has an inherent advantage of processing gain, code division multiple access, spread spectrum and security.

16 Claims, 6 Drawing Sheets

— 7 Chip OFC
······· Single Carrier

— 7 bit OFC
······· Single Carrier

— 7 Bit Barker Code OFC
------- 7 Bit Barker Code Single Carrier

— 7 Chip OFC
------- Single Carrier

— Original OFC
— Convolution of OFC with Chirp
— OFC after Chirp Deconvolution

—— Upper: Auto Correlation - System
------ Lower: OFC-OFC Autocorrelation

—— Experiment
------ COM Prediction

ORTHOGONAL FREQUENCY CODING FOR SURFACE ACOUSTIC WAVE COMMUNICATION, TAG AND SENSOR APPLICATION

This application claims the benefit of priority to U.S. Provisional application Ser. No. 60/650,843 filed on Feb. 8, 2005.

FIELD OF THE INVENTION

This invention relates to signal encoding and, in particular, to apparatus, systems, devices and methods for generating, distributing, processing and detecting orthogonal frequency coding for surface acoustic wave and silicon tags and sensors for transmission of sensor identification and information.

BACKGROUND AND PRIOR ART

The surface acoustic wave (SAW) sensor offers advantages in that it is wireless, passive, small and has varying embodiments for different sensor applications. SAW sensors are capable of measuring physical, chemical and biological variables and have the ability to operate in harsh environments. In addition, there are a variety of ways of encoding the sensed data information for retrieval. Single sensor systems can typically use a single carrier RF frequency and a simple device embodiment, since tagging is not required. In a multi-sensor environment, it is necessary to both identify the sensor as well as obtain the sensed information. The SAW sensor then becomes both a sensor and a tag and must transmit identification and sensor information simultaneously.

Known SAW devices include delay line and resonator-based oscillators, differential delay lines, and devices utilizing multiple reflective structures. Single sensor systems can typically use a single carrier frequency and a simple coding technique, since tagging is not required. However, there are advantages of using spread spectrum techniques for device interrogation and coding, such as enhanced processing gain and greater interrogation power.

The use of orthogonal frequencies for a wealth of communication and signal processing applications is well known to those skilled in the art. Orthogonal frequencies are often used in an M-ary frequency shift keying (FSK) system. There is a required relationship between the local, or basis set, frequencies and their bandwidths which meets the orthogonality condition. If adjacent time chips have contiguous local stepped frequencies, then a stepped chirp response is obtained.

The technique disclosed in this patent include a novel spread spectrum coding that uses orthogonal frequency coding for SAW identification tags and sensors which enables unique sensor operation and identification in multi-sensor environments. The OFC technique of the present invention provides a wide bandwidth spread spectrum signal with all the inherent advantages obtained from the time-bandwidth product increase over the data bandwidth. The encoding technique is similar to M-ary in terms of its implementation where transducers or reflectors are built with the desired code. Implementations of the system architecture, the device configuration, and encoding and detection schemes of orthogonal frequency coding are presented.

SUMMARY OF THE INVENTION

A primary objective of the invention is to provide a new method, system, apparatus and device for applying orthogonal frequency coding to device for communications, tags and sensors.

A secondary objective of the invention is to provide a new method, system, apparatus and device that uses orthogonal frequency coding to allow for a wide and ultra-wide bandwidth coding.

A third objective of the invention is to provide a new method, system, apparatus and device that uses orthogonal frequency coding and allows for chirp interrogation for increased power.

A fourth objective of the invention is to provide a new method, system, apparatus and device that uses orthogonal frequency coding to allow for frequency and binary coding per bit.

A fifth objective of the invention is to provide a new method, system, apparatus and device that uses orthogonal frequency coding to allow for a reduced compressed pulse width as compared with pseudo noise (PN) sequence.

A sixth objective of the invention is to provide a new method, system, apparatus and device that uses orthogonal frequency coding to provide a secure code for increased data security.

A seventh objective of the invention is to provide a new method, system, apparatus and device that adds a pseudo noise (PN) sequence to the OFC coding to provide additional code diversity for tagging.

An eighth objective of the invention is to provide a new method, system, apparatus and device for using orthogonal frequency coding to achieve a processing gain.

A first preferred embodiment of the invention provides an orthogonal frequency coding technique for applying the orthogonal frequency coding to a surface acoustic wave device for ID tags and sensors. The tag includes a transceiver and at least one bank of reflectors and the reflectors are fabricated so that each reflector produces an orthogonal frequency corresponding to the carrier frequency. The device code is determined by the order of the orthogonal frequencies.

For the second embodiment, the novel orthogonal frequency coding technique, pseudo noise (PN) coding is applied to the OFC basis function. In this embodiment, in addition to OFC coding, each chip can be weighted as a±1, giving a PN-OFC coding. In this embodiment, the OFC technique allows for frequency and binary coding per bit and produces a reduced compressed pulse width as compared to the PN code and adds a level of security.

For the third embodiment, the orthogonal frequency technique of the present invention is applied to a surface acoustic wave (SAW) device for communication, tagging and sensors in a multi-sensor system. A transceiver interrogates the tag with a stepped chirp and the tag transmits a scrambled signal in response to the interrogation. At the transceiver, an opposite stepped chirp is applied to the tag response to unscramble the code sequence and the resulting signal is match filtered with the coded PN-OFC producing the correlated compressed pulse.

Further objects and advantages of this invention will be apparent from the following detailed description of preferred embodiments which are illustrated schematically in the accompanying drawings.

DESCRIPTION OF THE PREFERRED EMBODIMENTS

Figure 1:
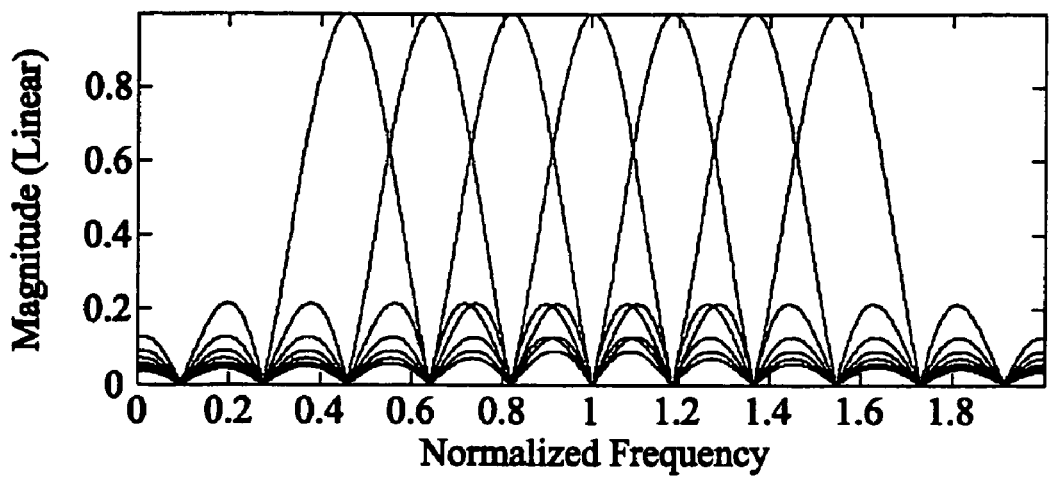
FIG. 1 is an example of a stepped chirp response.

Before explaining the disclosed embodiments of the present invention in detail it is to be understood that the invention is not limited in its application to the details of the particular arrangements shown since the invention is capable of other embodiments. Also, the terminology used herein is for the purpose of description and not of limitation.

The following is a list of the reference numbers used in the drawings and the detailed specification to identify components:

| Reference No. | Component |
| --- | --- |
| 121-127 | Bank of reflectors |
| 140 | Transducer |
| 150 | Stepped up chirp signal |
| 160 | Scrambled response signal |
| 200 | OFC SAW Transceiver |
| 210 | Tag |
| 220 | Up-chirp |
| 230 | Tag impulse response |
| 240 | Down-chirp |
| 250 | Receiver |
| 300 | Transducer |
| 305 | Propagation path |
| 310 | Reflectors |
| 320 | Reflectors |
| 330 | Transceiver |

It would be useful to review orthogonal frequency before discussing the methods, systems, apparatus and devices for generating, distributing, processing and detecting orthogonal frequency coding according to the present invention.

Orthogonal frequencies are used to spread the signal bandwidth. The orthogonality condition describes a relationship between the local chip frequencies and their bandwidths. As an example, consider the stepped linear chirp shown in FIG. 1. Seven coherent carriers are used to generate the signal shown. Each chip contains an integer number of carrier half cycles due to the orthogonality condition. Under these conditions, the resulting waveform is continuous. The conditions, however, do not require that the local frequency of adjacent chips, that are contiguous in time, be contiguous in frequency. Instead, the time function of a bit provides a level of frequency coding by allowing a shuffling of the chip frequencies in time.

Figure 2:
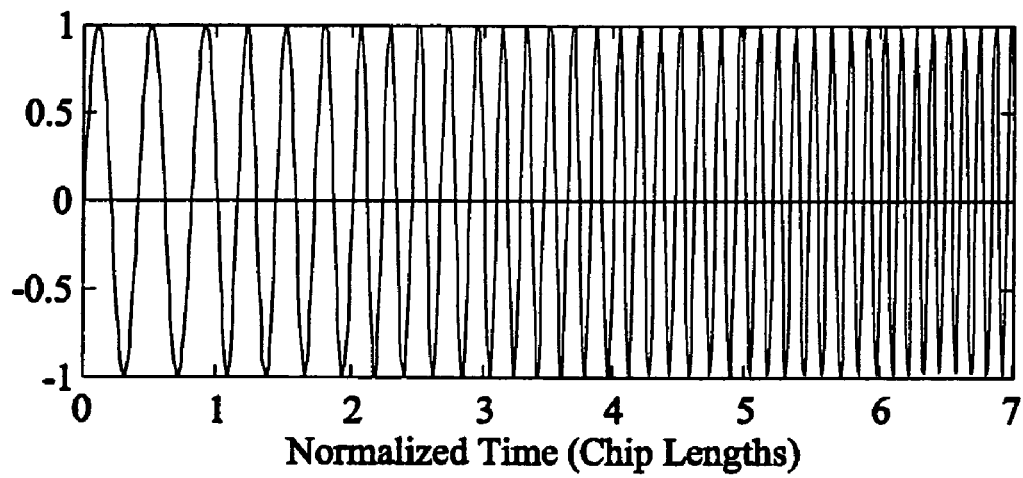
FIG. 2 is an example of an OFC chip frequency response.
Figure 3:
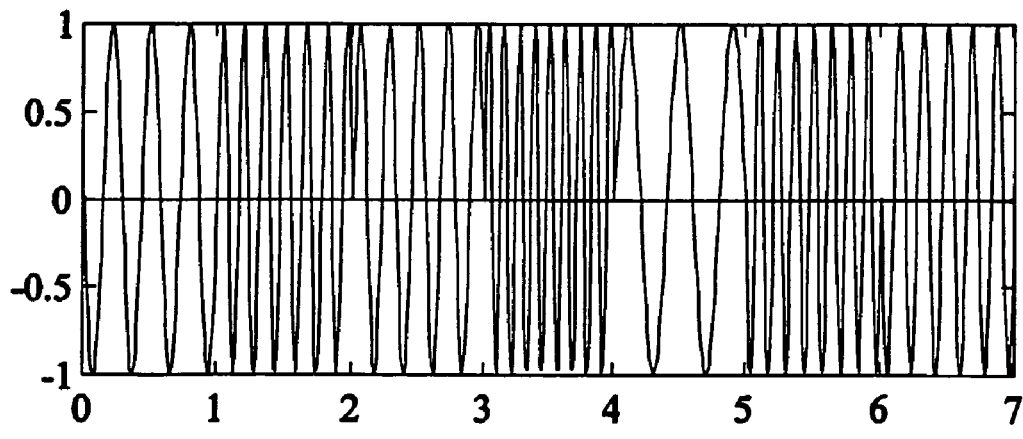
FIG. 3 is an example of a 7 chip OFC waveform based on the placement of chips.

The chip frequency response is shown in FIG. 2. These responses are a series of sampling functions with null bandwidths equal to $2 \cdot \tau^{-1}$. In addition, the sampling function center frequencies are separated by multiples of $\tau^{-1}$. Coding is accomplished by shuffling the chips to produce a signal such as shown in FIG. 3, wherein the adjacent frequencies are not required to be sequential. The code is now determined by the order in which the orthogonal frequencies are used. Both signals occupy the same bandwidth and the coded information is contained within the signal phase. A more complete description of orthogonal frequency coding is given in D. C. Malocha, et al., "Orthogonal frequency coding for SAW device application," 2004 IEEE International Ultrasonics, Ferroelectrics, and Frequency Control 50th Anniversary Joint Conference, in press, which is incorporated herein by reference.

In the example shown in FIG. 3, the seven local chip frequencies are contiguous in frequency but are not ordered sequentially in time and the chip weights are all unity. If the local chip frequencies were ordered high to low or low to high, the time sequence would be a stepped down-chirp and up-chirp, respectively. The start of the chip carrier frequency begins at zero amplitude, as seen in FIGS. 2 and 3, which is a condition of the orthogonality.

The OFC technique of the present invention provides a wide bandwidth spread spectrum signal with all the inherent advantages obtained from the time-bandwidth product increase over the data bandwidth. The OFC concept allows for a wide bandwidth, chirp interrogation, frequency and binary coding per bit, a reduced compressed pulse width as compared to a PN sequence, and a secure code. The OFC technique of the present invention can be applied to ultra-wide-band applications since the fractional bandwidth can exceed 20% and can be used in a multi-tag or sensor environment by using proper coding techniques.

Figure 4:
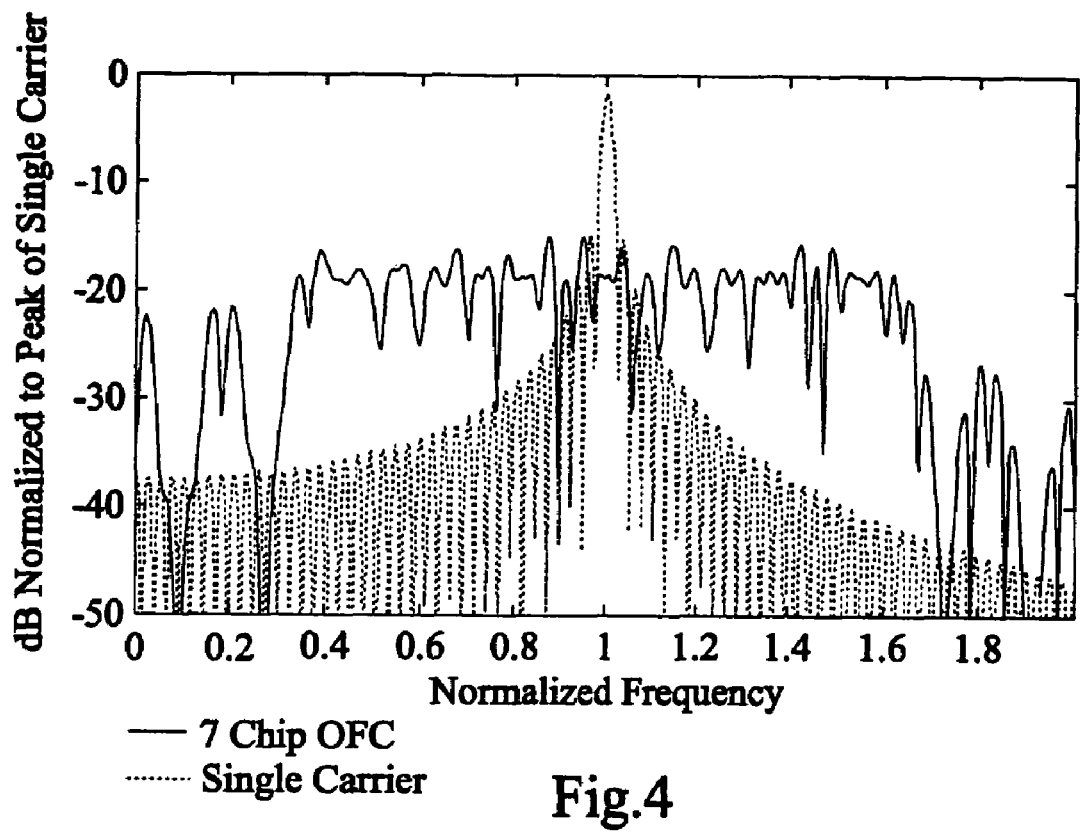
FIG. 4 is a frequency response of a 7 chip OFC device (solid line) and a single carrier (dashed line).
Figure 5:
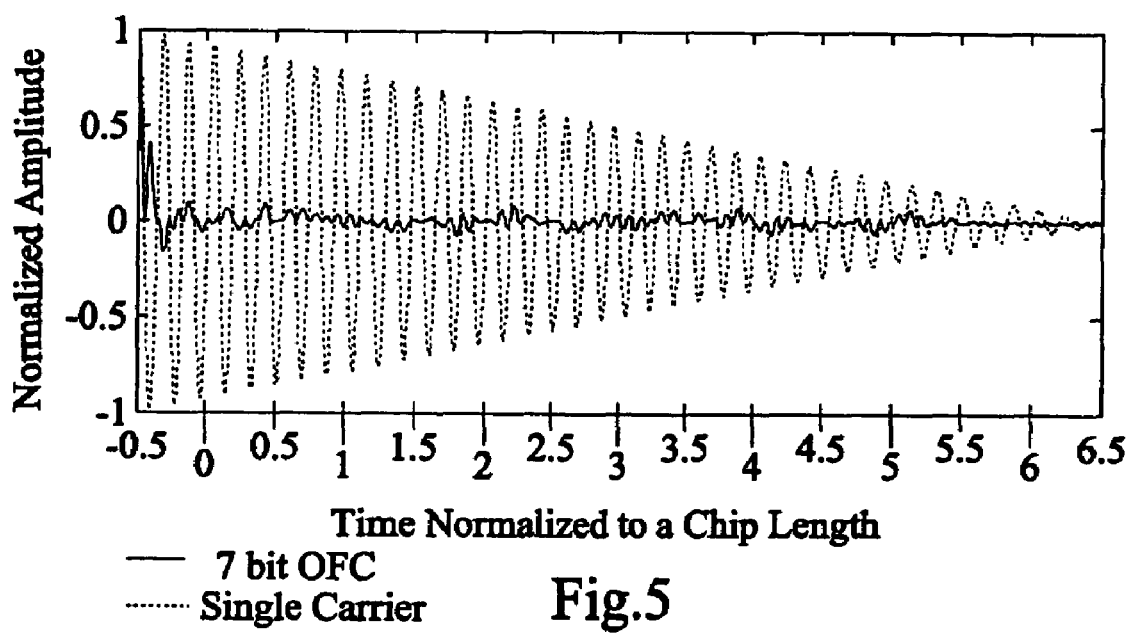
FIG. 5 shows the time autocorrelation (½ length) of a single carrier BPSK (dashed line) and a 7 chip OFC (solid line) signals having approximately the same time length.

In the preferred embodiment, apparatus, systems, devices and methods of the present invention provide an orthogonal frequency coding technique for SAW sensors. The given chip sequence represents the OFC for the bit. If there are J-chips with J different frequencies in a bit, then there are J factorial possible permutations of the frequencies within the bit. A signal can be composed of multiple bits, with each bit having the same OFC or differing OFC. For the case of a signal, J-chips long and having a single carrier frequency, the signal is a simple gated RF burst $\tau_B$ long. The frequency responses of a 7 bit OFC (solid line) and a single carrier signal (dashed line) are shown in FIG. 4, with both time functions normalized to unity and having identical impulse response lengths. The single carrier, shown as the dashed line, is narrowband and has approximately 17 dB greater amplitude at center frequency, as compared to the OFC (J=7), shown as a solid line, which has a much wider bandwidth. The time domain autocorrelation for the signals is shown in FIG. 5. The peak autocorrelation is exactly the same, but the OFC compressed pulse width is approximately $0.28 \cdot \tau_C$, as compared with the single carrier compressed pulse width of approximately a bit width, $\tau_B = 7 \cdot \tau_C$. This provides the measure of the processing gain (PG), which is the ratio of the compressed pulse width to the bit length, or in this case, PG=49.

Figure 6:
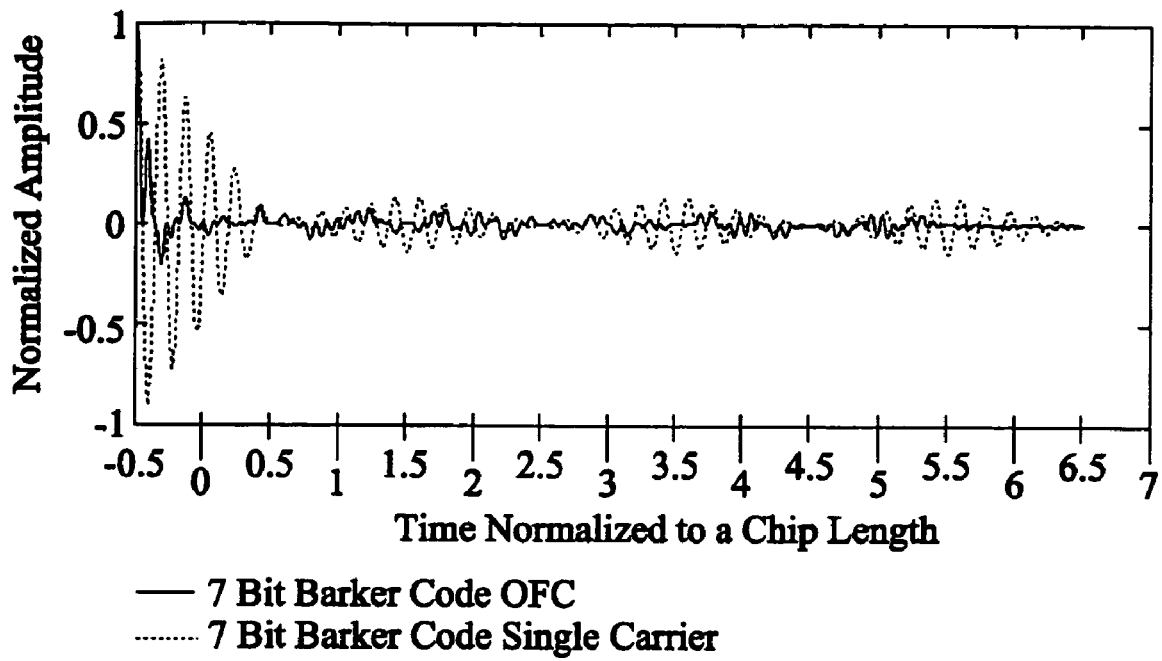
FIG. 6 shows the time autocorrelation (½ impulse length) of a single carrier PN code (dashed line) and a PN-OFC (solid line) signal having a 7 chip Barker code modulating the chips of both signals.

In a preferred embodiment, in addition to the OFC coding, each chip can be weighted as ±1, giving a pseudo noise (PN) code in addition to the OFC, namely PN-OFC. This does not provide any additional processing gain since there is no increase in the time bandwidth product, but does provide additional code diversity for tagging. FIG. 6 shows the time autocorrelation of a 7 bit Barker code applied to an OFC (solid line) and a single carrier (dashed line) frequency. The PN code has a compressed pulse width of $\tau_c \cdot 2$, or a $PG_{PN}=7$ as compared $PG_{PN-OFC}=49$ achieved with orthogonal frequency coding. The compressed pulse width of the OFC is a function of the bandwidth spread and not the PN code, yielding comparable pulse-width and side lobe results as shown in FIGS. 5 and 6 without PN-code and with PN-code, respectively.

Figure 7:
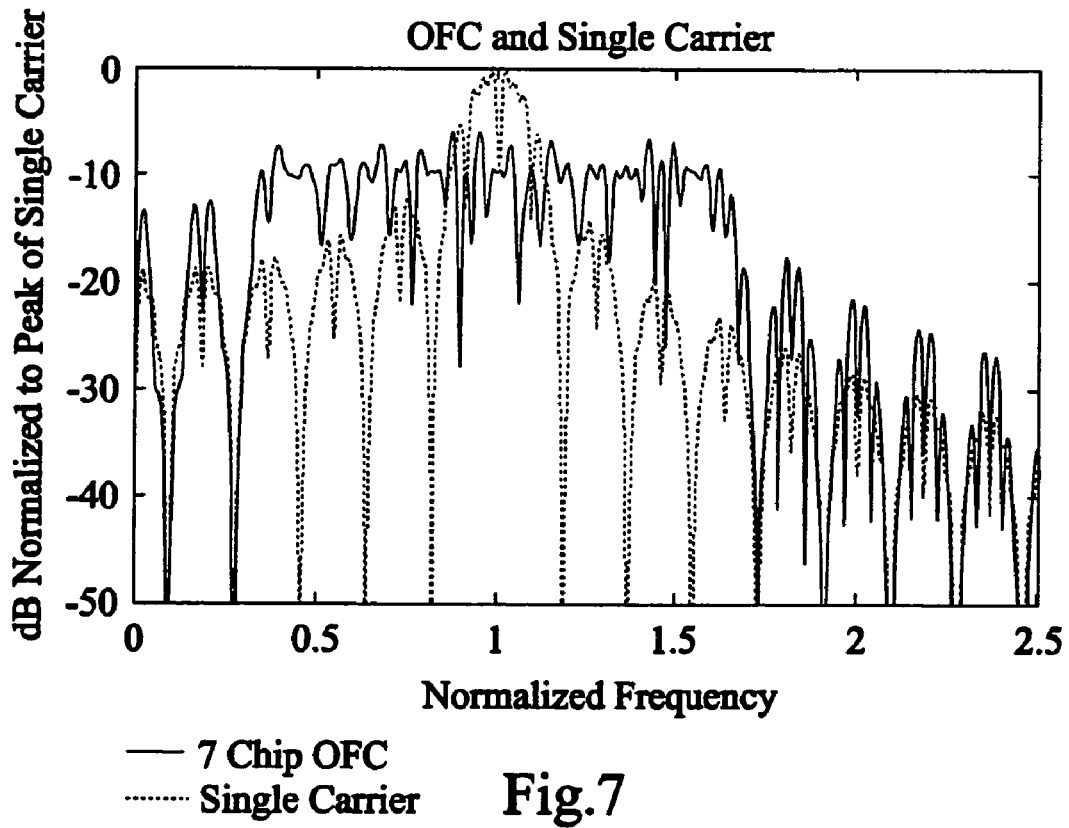
FIG. 7 shows the frequency response of a 7 chip PN-OFC signal (solid line) and a single carrier signal (dashed line).

The PN-OFC has an increased PG and a narrower compressed pulse peak over just the PN sequence, proportional to the bandwidth spreading of the OFC. FIG. 7 compares the PN-OFC and conventional PN frequency response, the bandwidth is spread based on the OFC design.

Figure 8:
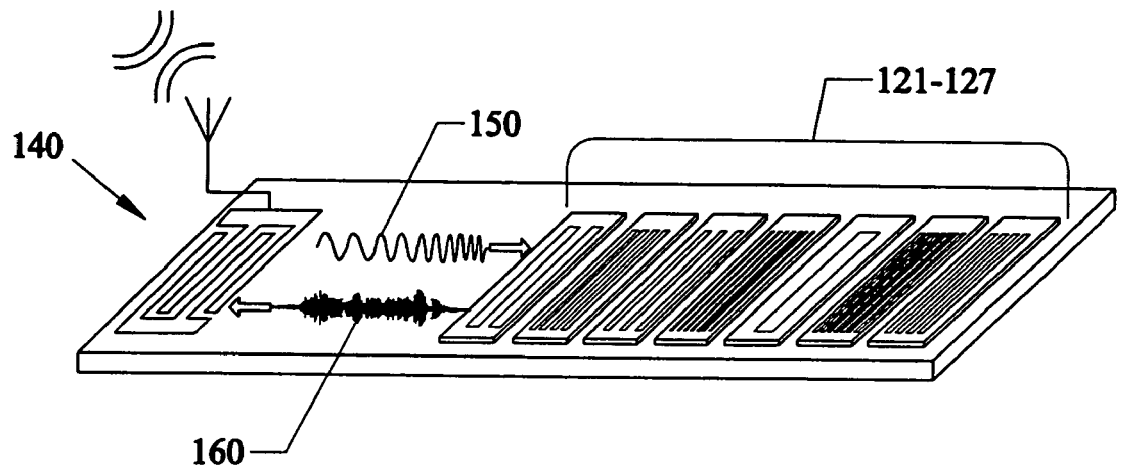
FIG. 8 is a block diagram of an example of an OFC SAW system according to the present invention.

OFC waveforms can be employed in SAW devices using shorted periodic reflector gratings as shown in FIG. 8. Each chip of the OFC waveform is implemented using a shorted periodic reflector grating 121-127. The grating periodicities are chosen so that the grating center frequencies correspond to the chip carrier frequencies. In order to keep the chip length approximately constant, each grating must contain different numbers of electrodes as the periodicity changes. This is a direct result of the orthogonality condition. The equation used to find the grating electrode counts is shown below.

$$N_j = \tau_c \cdot f_j \quad (1)$$

This equation shows that the grating electrode count is directly proportional to frequency. In addition, the normalized metal thickness also increases with frequency. Therefore, in a device fabricated with a single metal thickness for all reflectors, the magnitude of SAW reflection for each chip will not be equal.

Figure 9:
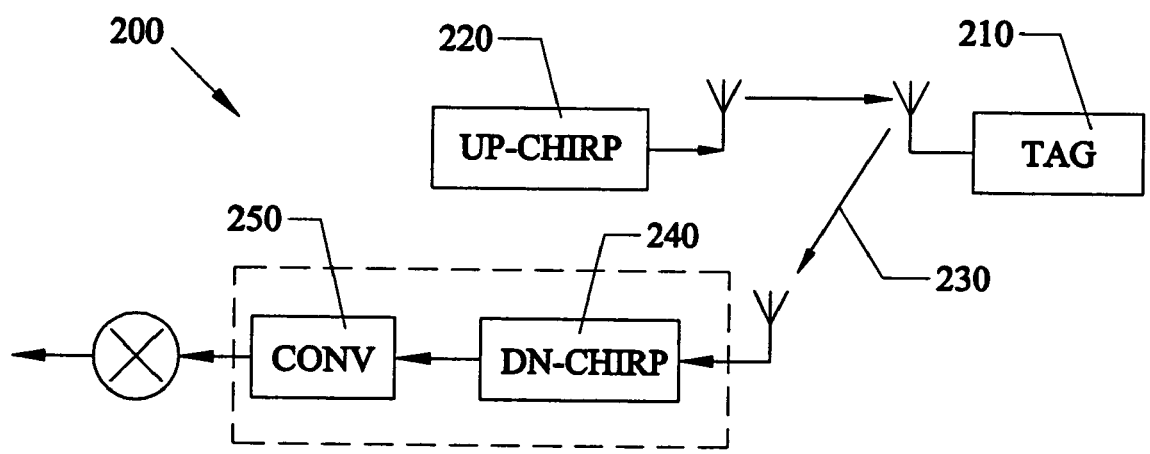
FIG. 9 is a schematic diagram of an example of a 7 chip OFC SAW tag according to the present invention.
Figure 10:
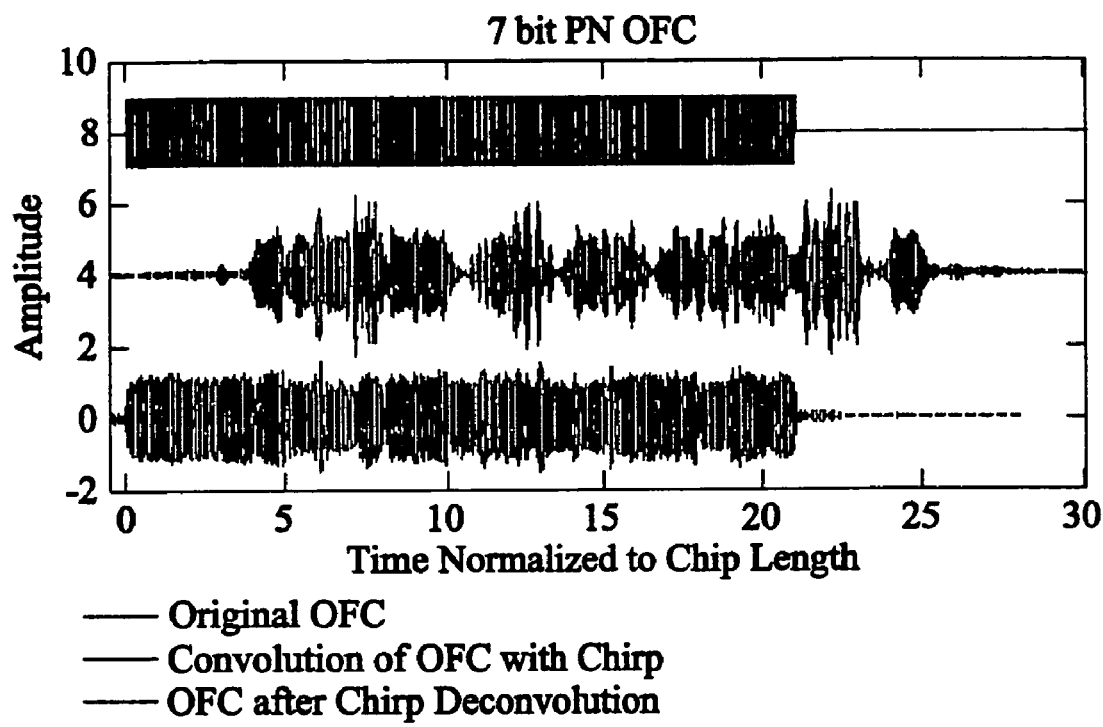
FIG. 10 shows an OFC-PN coded waveform (top), an example of a noise-like signal returned in response to a stepped linear up chirp interrogation (center), and the compressed pulse results after application of down chirp and matched filtering (bottom).

The OFC SAW transceiver 200 block diagram is shown in FIG. 9. The SAW tag 210 is interrogated with a linear stepped up chirp 220 (FIG. 10 top) possessing the same time length and bandwidth as the tag impulse response 230. For a given peak amplitude, the chirp provides increased power over a given bandwidth as compared to a simple RF tone burst. A noise-like tag response signal 230 as shown in the center signal in FIG. 10 is returned from the identification tag 210. Since orthogonal frequencies are used, the intersymbol interference is drastically reduced when compared with a conventional PN sequence. A band-limited version of the tag's impulse response results after a down chirp 240 is applied. The signal is then match filtered to produce a compressed pulse as shown in the bottom signal in FIG. 10.

For example, orthogonal frequency coding is applied to a SAW tag system wherein the tag is designed having a center frequency of 235 MHz, composed of a 3-bit, 7 chip Barker code with $\tau_c=0.1$ µsec, using 7 reflectors 121-127 each having a different center frequency dependent on the electrode period. For this example, the reflectors 121-127 are assumed to have equal reflectivity and have a rect time function response. A device schematic is shown in FIG. 8. The input transducer 140 is wideband and its effect is assumed negligible for this example. The OFC tag impulse response 160 has uniform amplitude versus time and is 21 chips long. The tag is interrogated with a linear stepped up-chirp 150 having the same center frequency, time length and bandwidth as one bit. By using a chirp signal 150, the interrogation signal power is increased over that of a simple RF burst. The re-transmitted signal 160 from the tag is 28 chips long due to the convolution of the interrogation chirp and tag impulse response; producing a noise like signal 160. The tag response is a spread spectrum signal which is wideband and has inherent security. Since the chips have orthogonal frequencies, there is no intersymbol interference with overlapping chips, unlike a conventional PN sequence.

Figure 11:
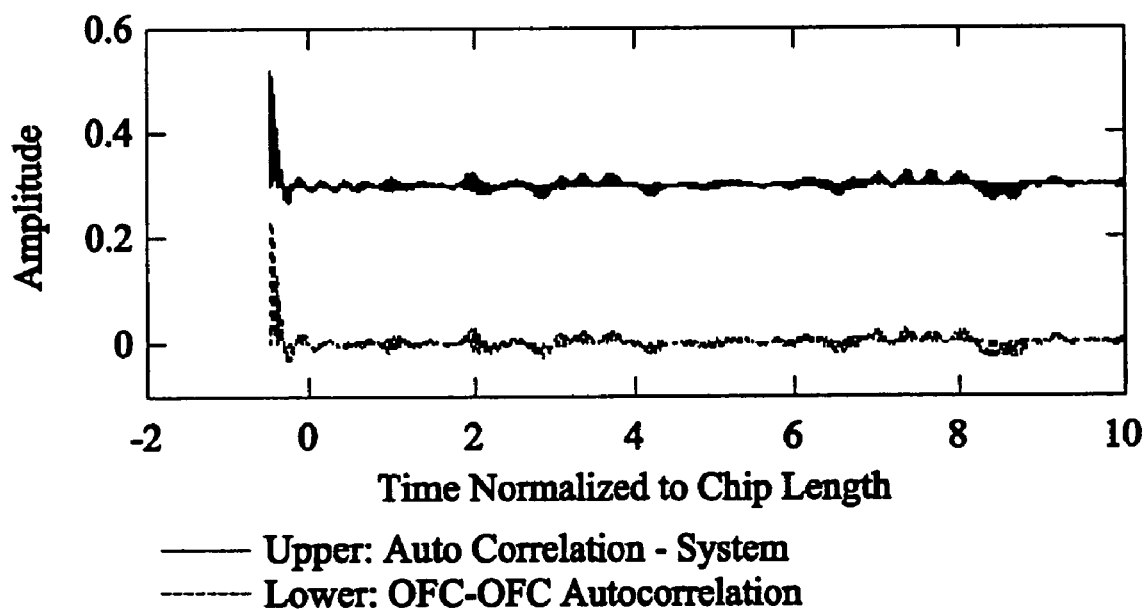
FIG. 11 shows the compressed pulse produced by matched filtering the unscrambled tag response.

Referring back to FIG. 9, at the receiver 250 a corresponding stepped down chirp 240 is applied to the tag response signal 230, which unscrambles the code sequence producing a reconstructed signal that is approximately 21 chips long and has some amplitude modulation (FIG. 10 bottom). The signal is then match filtered with the coded PN-OFC producing the correlated compressed pulse as shown in FIG. 11. The resulting compressed pulse is approximately $0.28\,\tau_c$ long, yielding the processing gain of 49. FIG. 11 shows the ideal convolution of the orthogonal frequency coded signal and the system simulation. The compressed pulses shown in FIG. 11 are nearly identical, demonstrating that the chirp interrogation signal and matched filter process accurately reconstructs the desired tag signal.

Figure 12:
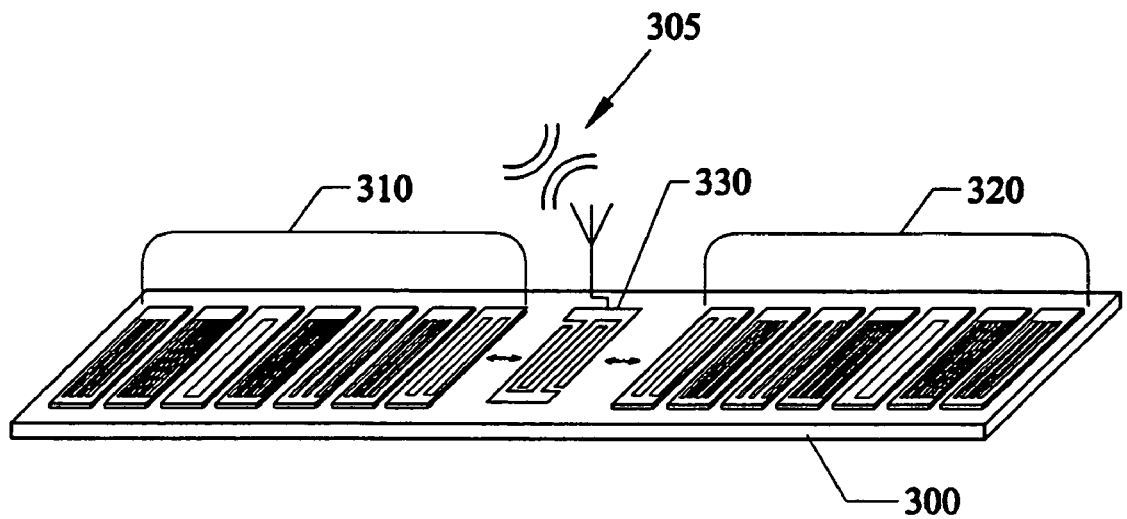
FIG. 12 is a schematic diagram of an example of an OFC SAW sensor implementation.
Figure 13:
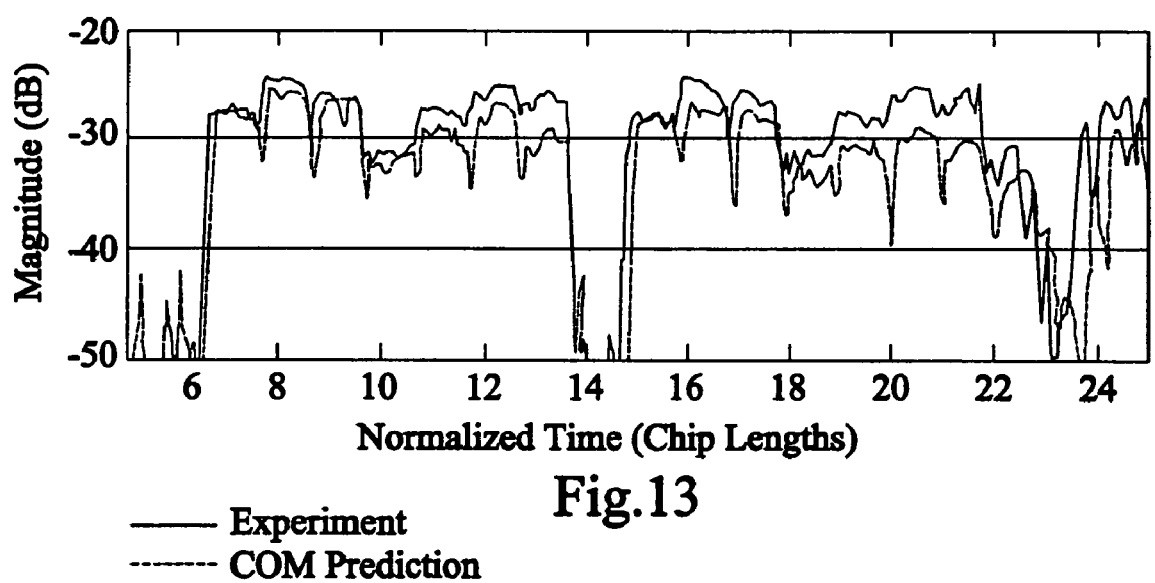
FIG. 13 shows two compressed pulses having a differential time delay between pulses.

The OFC apparatus, systems, devices and methods of the present invention are readily applied to SAW sensing applications. The resulting system offers the advantage of simultaneous sensing and tagging. Measurement of the received sensor OFC signal in a matched filter system, using differential or calibrated delay, allows for sensing of an environmental temperature, pressure, gases, liquids, or bio-agents within range of the surface acoustic device. Application of sensing materials in the propagation path 305 to and from the transceiver 330, on the transducer 300 or on reflectors 310 and 320 can be used for specific targeted measurands. An example is as shown in FIG. 12.

In summary, the present invention provides new apparatus, systems, devices and methods for using the OFC technique disclosed above to provide a wide bandwidth spread spectrum signal with all the inherent advantages obtained from the time-bandwidth product increase over the data bandwidth. The OFC technique of the present invention allows for a wide bandwidth, chirp interrogation, frequency and binary coding per bit, a reduced compressed pulse width as compared to a PN sequence, and a secure code. This approach can be applied to ultra-wide-band applications since the fractional bandwidth can exceed 20%. The approach can be used in a multi-tag or sensor environment by using proper coding techniques. A SAW tag example demonstrated the coding approach and showed good auto and cross correlation results.

While the invention has been described, disclosed, illustrated and shown in various terms of certain embodiments or modifications which it has presumed in practice, the scope of the invention is not intended to be, nor should it be deemed to be, limited thereby and such other modifications or embodiments as may be suggested by the teachings herein are particularly reserved especially as they fall within the breadth and scope of the claims here appended.

We claim:
1. An apparatus comprising:
a transducer for generating an orthogonal frequency coded signal, the transducer comprising a substrate and plural chips fabricated on said substrate for producing plural orthogonal stepped frequencies corresponding to said orthogonal interrogation signal; and
a transceiver coupled with said transducer for transmitting said orthogonal frequency coded signal from and receiving an orthogonal interrogation signal to said transducer, wherein said plural orthogonal frequencies are ordered pseudo-randomly by frequency to produce a chip sequence to represent the orthogonal frequency of a bit, wherein said plural orthogonal frequencies are combined to form said orthogonal frequency coded signal.

2. The apparatus of claim 1, wherein said transducer comprises:
a first reflector producing a first frequency; and
a second reflector producing a second frequency, wherein said first frequency and said second frequency are orthogonal within a bandwidth.

3. The apparatus of claim 1, wherein the orthogonal frequency coded signal comprises:
plural chip sequences composed of plural bits, each of said plural bits having the same orthogonal frequency coding.

4. The apparatus of claim 1, wherein the orthogonal frequency coded signal comprises:
plural chip sequences composed of plural bits, each of said plural bits having a different orthogonal frequency coding.

5. The apparatus of claim 1, wherein said plural orthogonal stepped frequencies of said plural chips are contiguous in time and are not contiguous in frequency, wherein an identification corresponding to the transducer is determined by the order of the plural orthogonal frequencies.

6. A communication system comprising:
a tag producing an orthogonal frequency coded signal in response to an orthogonal interrogation signal, the tag including a substrate having plural reflector gratings fabricated on said substrate, each of said plural reflector gratins having a one of plural orthogonal frequencies within a bandwidth for identifying said tag, said plural orthogonal frequencies correspond to said orthogonal interrogation signal, wherein said plural orthogonal frequencies form said orthogonal frequency coded signal;
a first transceiver in communication with said tag for transmitting said orthogonal interrogation signal to said tag and receiving said orthogonal frequency coded signal in response, wherein said orthogonal frequency coded signal identifies said tag; and
a second transceiver coupled with said plural reflector gratings for receiving said orthogonal interrogation signal and transmitting said orthogonal frequency coded signal in response.

7. The system of claim 6, wherein said first transceiver comprises:
a frequency generator for generating said orthogonal interrogation signal, wherein said orthogonal interrogation signal is one of a stepped chirp signal or a coded signal corresponding to a specific tag within said bandwidth; and
an antenna for transmitting said orthogonal interrogation signal to said tag and receiving said orthogonal frequency coded signal from said tag in response to said orthogonal interrogation signal.

8. The system of claim 6, further comprising:
a surface acoustic wave device, wherein said tag is connected with said surface acoustic wave device and said orthogonal frequency coded signal identifies said surface acoustic wave device.

9. The system of claim 8, further comprising:
a sensor connected with said surface acoustic wave device for collecting information.

10. The system of claim 8, wherein said sensor comprises:
a bank of reflectors for producing a sensor orthogonal frequency coded signal, wherein measurement of the sensor orthogonal frequency coded signal determines a condition of an environment within range of said surface acoustic wave device.

11. A method for producing a communication device comprising the steps of:
applying a transceiver to a substrate; and
fabricating plural reflector gratings on said substrate in communication with said transceiver to produce a tag, wherein said plural reflector gratings generate an orthogonal frequency coded tag responsive signal that identifies said tag in response to receiving an orthogonal interrogation signal, the plural reflector gratings fabricated on said substrate for producing plural orthogonal stepped frequencies corresponding to said orthogonal interrogation signal, wherein said plural orthogonal frequencies are ordered pseudo-randomly by frequency to produce a chip sequence to represent the orthogonal frequency of a bit, wherein said plural orthogonal frequencies are combined to form said orthogonal frequency coded signal.

12. The method of claim 11, wherein the fabricating step comprises the steps of:
selecting a chip carrier frequency; and
choosing plural grating periodicities such that a grating center frequency of said plural reflector gratings corresponds to said selected chip carrier frequency.

13. A method for communicating comprising the steps of:
providing a tag having a transducer and plural reflector gratings coupled with the transducer, each one of the plural reflector gratings producing a frequency that is orthogonal within a bandwidth;
coding a the tag with a code including plural frequencies are ordered pseudo-randomly by frequency to produce a chip sequence to represent the orthogonal frequency of a bit, wherein said plural orthogonal frequencies are combined to form a orthogonal frequency coded signal;
transmitting an orthogonal interrogation signal having a stepped chirp within the bandwidth to said coded tag;
receiving said interrogation signal at said coded tag; and
transmitting an orthogonal frequency coded response signal from said tag in response to said received orthogonal interrogation signal.

14. The method of claim 13, wherein the tag coding step comprises the steps of:
configuring a bank of reflectors, wherein the frequency response of each of the reflectors in said bank of reflectors produces an orthogonal frequency corresponding to the stepped chirp interrogation signal, wherein the code applied to the tag is determined by the configuration of the bank of reflectors and the orthogonal frequency coded signal produced by the bank of reflector.

15. The method of claim 13, wherein the orthogonal interrogation signal transmitting step includes:
generating an up-chirp signal of continuous frequencies meeting an orthogonality condition corresponding to said bandwidth.

16. The method of claim 13, further comprising:
applying a pseudo noise code to the orthogonal frequency coded response signal.

* * * * *